United States Patent [19]

Neu

[11] 3,784,878

[45] Jan. 8, 1974

[54] MATRIX ASSEMBLY

[75] Inventor: John P. Neu, Berkeley, Ill.

[73] Assignee: GTE Automatic Electric Laboratories Incorporated, Northlake, Ill.

[22] Filed: July 6, 1972

[21] Appl. No.: 269,346

[52] U.S. Cl.317/101 CE, 317/101 CP, 317/101 CC, 339/18 C

[51] Int. Cl. .............................................. H05k 1/04

[58] Field of Search .............. 317/101 CE, 101 CW, 317/101 CP; 339/18 C, 18 P

[56] References Cited

UNITED STATES PATENTS

| | | | |
|---|---|---|---|
| 3,670,205 | 6/1972 | Dixon et al. | 317/101 CE |
| 2,853,656 | 9/1958 | Dowds | 317/101 CP |
| 3,902,628 | 9/1959 | Leno | 317/101 CP |
| 3,078,353 | 2/1963 | Skelton | 339/18 C |

*Primary Examiner*—David Smith, Jr.
*Attorney*—Robert J. Black

[57] ABSTRACT

A matrix assembly comprised of a plurality of electrical components (diodes) having one lead or electrical connector thereof permanently or semi-permanently attached to a printed circuit board and in electrical contact with the printed circuit conductors on it. The electrical components are disposed and retained within openings extending through a spacer, in a fashion such that the other lead or electrical connector thereof functions as a plug to receive a contact pin receptacle. The openings in the spacer function to support the electrical components and to guide the contact pin receptacles into engagement with the electrical connectors of the electrical components. In this fashion, an electrical path may be readily made, or interrupted, to program or encode the matrix circuit, by simply affixing an electrical component into the appropriate ones of the openings in the spacer and electrically connecting the one lead thereof. Upon being plugged into the contact pin receptacles, the electrical interconnections are established. The contact pin receptacles can be affixed to another support member such as, for example, another printed circuit board.

10 Claims, 3 Drawing Figures

PATENTED JAN 8 1974 3,784,878

MATRIX ASSEMBLY

BACKGROUND OF THE INVENTION

1. Field of the Invention

This invention relates, generally, to a matrix assembly and, more particularly, to an assembly whereby electrical paths may be readily made, or interrupted, in a matrix-type circuit. More particularly still, it relates to an assembly supporting one or more electrical components in a fashion such that one of the electrical connectors of the electrical components functions as a plug to accept a contact pin receptacle.

Matrix-type circuits find use where pre-selected and easily arranged interconnections between different groups of conductors are required. Such circuits preferably are constructed at least in part by the techniques of printed circuit manufacture, and are commonly plugged into existing circuitry. The latter is accomplished, in many cases, by means of a patch board panel, with patch cords establishing electrical connections to create a predetermined program or encoding. To establish a program or to encode the matrix in this fashion is time consuming, costly and not readily susceptible to easily and quickly being changed.

2. Description of the Prior Art

With these matrix-type circuits, the interconnections between different groups of conductors many times are made through various electrical components, usually diodes. Various different arrangements and assemblies have been used in the past, to establish a connection or connections with these electrical components, in both matrix-type circuits as well as in other applications where printed circuit mounting boards are used. One such apparatus is disclosed in U.S. Pat. No. 3,437,740. The electrical components of the matrix have one electrical connector permanently or semi-permanently attached to a conductor on the printed circuit mounting board. The other electrical connector of each of the electrical components is releasably retained and secured by an L-shaped flexible metallic element. The arrangement purportedly is such that changes in the interconnections between the groups of conductors can be made easily, efficiently, and quickly so that the board is not damaged and so that down time is minimized.

In U.S. Pat. No. 3,290,558, a mounting arrangement for diodes is disclosed wherein the diodes are supported in a tapered opening in a printed circuit board, and are connected to matrix conductors on each of the opposite sides of the printed circuit board.

In U.S. Pat. No. 3,218,606, a socket assembly for printed circuits is disclosed wherein a metallic receptacle makes electrical contact between component leads and printed circuit conductors on one board and a printed circuit table.

Still another method of mounting electrical components between two parallel printed circuit boards is disclosed in U.S. Pat. No. 3,139,560. The two printed circuit boards are retained in spaced relationship by means of a spacer member.

Other methods of mounting electrical components permanently or semi-permanently to printed circuit boards are disclosed in U.S. Pat. Nos. 2,889,393; 2,969,517; 3,008,112; 3,114,586 and 3,573,707.

SUMMARY OF THE INVENTION

Broadly, the matrix assembly of the present invention includes a plurality of electrical components (diodes) having one lead or electrical connector thereof permanently or semi-permanently attached to a printed circuit board and in electrical contact with the printed circuit conductors on it. The electrical components are disposed and retained within openings extending through a spacer, in a fashion such that the other lead or electrical connector thereof functions as a plug to receive a contact pin receptacle. The openings in the spacer function to support the electrical components and to guide the contact pin receptacles into engagement with the electrical connectors of the electrical components. In this fashion, an electrical path may be readily made, or interrupted, to program or encode the matrix circuit, by simply affixing an electrical component into the appropriate ones of the openings in the spacer and electrically connecting the one lead thereof. Upon being plugged into the contact pin receptacles, the electrical interconnections are established. The contact pin receptacles can be affixed to another support member such as, for example, another printed circuit board.

Accordingly, it is an object of the present invention to provide an improved matrix assembly.

More particularly, it is an object to provide an improved arrangement for an assembly whereby electrical paths may be readily made, or interrupted, in a matrix-type circuit.

More particularly still, it is an object to provide an improved assembly supporting one or more electrical components in a fashion such that one of the electrical connectors of the electrical components functions as a plug to accept a contact pin receptacle.

A still further object is to provide an improved matrix assembly constructed and assembled in a fashion such that changes in the interconnections between the groups of conductors can be made easily, efficiently, and quickly so that the printed circuit board or boards thereof are not damaged, and so that down time is minimized.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings in which:

FIG. 1 is a sectional view of a portion of a matrix assembly or arrangement exemplary of the present invention;

FIG. 2 is a sectional view of a matrix assembly generally illustrating an alternative manner in which the electrical connections and interconnections can be established between the electrical components and the different groups of conductors; and FIG. 3 is still another view of the matrix assembly generally illustrating still another manner in which the electrical interconnections can be established.

DESCRIPTION OF A PREFERRED EMBODIMENT

Figure 1:
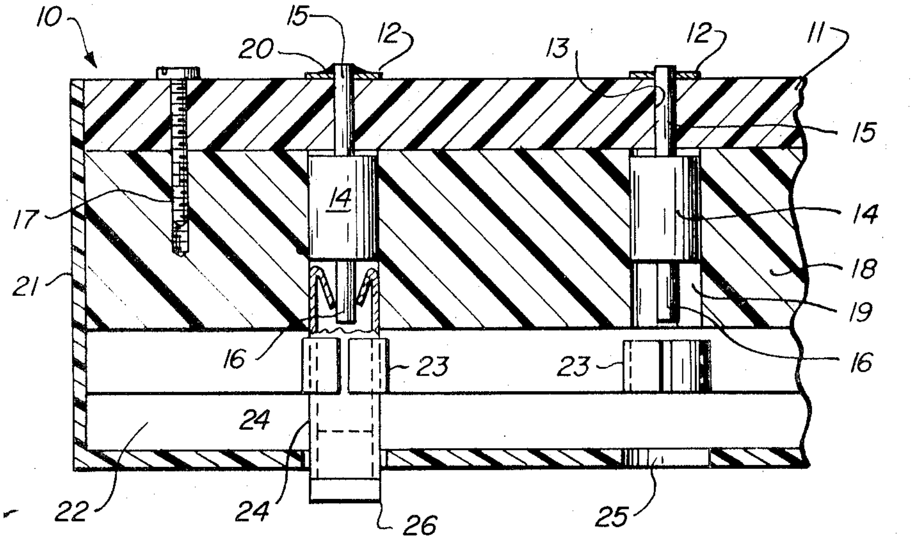

Referring now to the drawing, in FIG. 1 there is illustrated a matrix assembly 10 exemplary of the invention including a printed circuit board 11 having a spacer 18 of a non-conductive material affixed to the one face thereof, in an appropriate fashion, such as, for example, by means of threaded screws 17. As illustrated, the spacer 18 is a planar member co-extensive in area with the printed circuit board 11, however, from the description below, it will be appreciated that the spacer 18 could comprise a plurality of smaller planar members affixed to the printed circuit board to function in the described fashion.

The spacer 18 has a number of openings 19 extending through it which are proportioned to receive and retain therein an electrical component 14 which may be, for example, a diode. The electrical components 14 have electrical connectors 15 and 16 extending from each of its opposite ends, and one of the electrical connectors, such as the electrical connector 15, is extended through holes 13 in the printed circuit board 11, and permanently or semi-permanently affixed with the printed conductor means 12 thereon, to establish electrical contact with the printed conductor means. It is apparent that the printed conductor means, the holes 13 and the openings 19 in the spacer 18 all are positionally arranged so that the electrical components 14 can be inserted within the openings 19 in the spacer 18, so that the one electrical connector thereof can be extended through the holes 13 and electrically connected to the printed circuit conductor means 12. The one electrical connector 15 can be permanently connected to the printed conductor means by, for example, a solder connection 20. Alternatively, a semi-permanent connection can be established as more fully described below.

The printed circuit board 11 with the spacer 18 affixed thereto and the electrical components 14 disposed within the openings 19 are "plugged in" a plug member 21 which can be, for example, a generally box-like member opened at its top so as to generally form a cover for the assembly 10. The plug member 21 has affixed therein an elongated contact strip 22 which may be of beryllium copper which is cut and formed to provide generally cylindrical-shaped contact pin clamps 23 thereon corresponding in number and positionally aligned with the openings 19 in the spacer 18. These contact pin clamps 23 are adapted to frictionally receive and retain therein a generally cylindrical-shaped contact pin receptacle 24. These contact pin receptacles 24 are extended through holes 25 in the plug member 21 and can be securely retained therein and within the contact pin clamps 23, by extending a tip or plug 26 of nylon or teflon into the opened terminal end thereof, to frictionally engage the side walls of the contact pin receptacles with the side walls of the holes 25.

Figure 2:
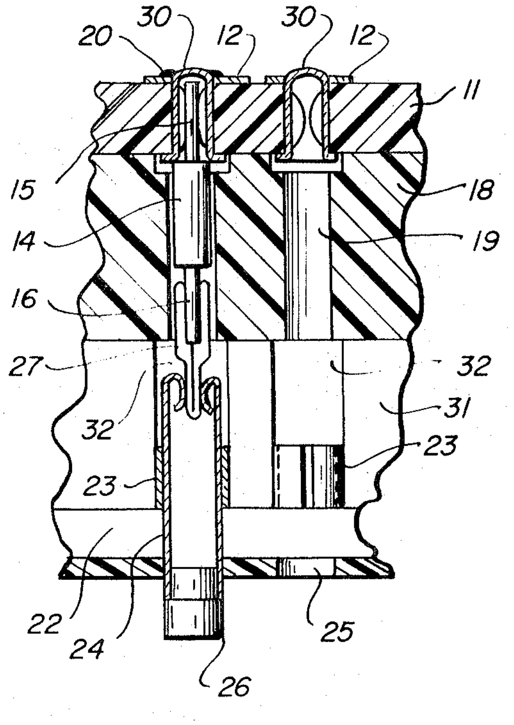
Figure 3:
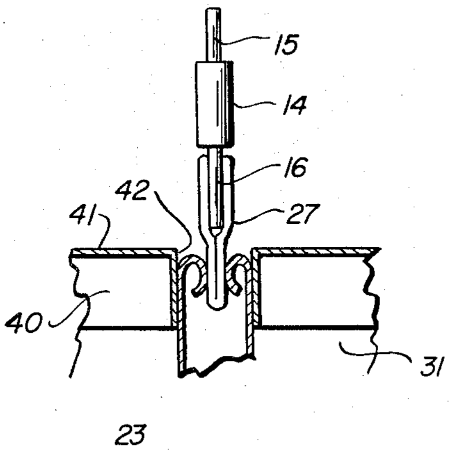

These contact pin receptacles 24, when the printed circuit board 11 and the spacer 18 affixed thereto are assembled with the plug member 21, extend into the openings 19, and the electrical connectors 16 of the electrical components 14 which are straight form plugs to engage within and to establish electrical contact with the contact pin receptacles 24. The upper terminal ends of the latter can be reversely folded into the interior thereof to form a gripping type engagement with the electrical connectors so that they cannot be easily removed from the contact pin receptacles, as generally illustrated in FIG. 1. Alternatively, the ends of the contact pin receptacles 24 can be reversely folded interiorly thereof in a generally curvilinear fashion to form a friction type grip with the electrical connectors so that the latter can be relatively easily removed therefrom, as illustrated in FIGS. 2 and 3. The openings 19 in the spacer 18 function to positionally retain the electrical components and to guide the ends of the contact pin receptacles 24 into engagement with the electrical connectors 16 of the electrical components 14, so that the printed circuit board 11 with the spacer 18 affixed thereto can be effectively plugged into the plug member 21.

In assembling, programing or encoding the matrix assembly 10, the electrical interconnections can be established in several different fashions. For example, electrical components 14 can be affixed within each of the openings 19 in the spacer 18 and with the one electrical connector 15 thereof connected to the printed conductor means 12 on the printed circuit board 11. The appropriate ones of the contact pin receptacles 24 can be affixed with the plug member 21 to establish the desired program or encoding, and then the printed circuit board 11 with the spacer 18 affixed to it extended into or plugged into the plug member 21. In doing so, the electrical connectors 16 are plugged into the contact pin receptacles 24, in the manner described above, to establish the desired interconnections.

Alternatively, only the electrical components 14 and the associated contact pin receptacles 24 corresponding to the desired program or encoding can be provided in the matrix assembly. Again, when the printed circuit board 11 with the spacer 18 affixed thereto is extended into or plugged into the plug member 21, the appropriate or desired electrical interconnections are established.

A still further method of programing or encoding the matrix assembly 10 is to secure an electrical component 14 in each of the openings 19, in the manner described above. Thereafter, the printed circuit board 11 with the spacer 18 affixed to it is extended into or plugged into the plug member 21. The desired electrical connections then are established by extending the contact pin receptacles 24 through the holes 25 therein to engage them with the contact pin clamps 23 of the contact strip 22 and with the electrical connector 16 of the electrical components 14. In this fashion, any desired interconnection can be established.

It will be appreciated from the above description that the programing or the encoding of the matrix assembly 10 can be made quickly, easily and efficiently without damaging the printed circuit board 11 and so that down time is minimized, simply by removing and replacing the appropriate ones of the contact pin receptacles 24.

The electrical components 14 can be semi-permanently secured to the printed circuit board 11 and within the openings 19 in the spacer 18, by affixing a socket 30 within the holes 13 in the printed circuit board 11. The socket 30 is electrically coupled to the printed conductor means 12 on the printed circuit board 11 by, for example, a solder connection 20. The sockets 30 are proportioned to frictionally receive and retain therein the electrical connector 15 of the electrical components 14, as illustrated.

The electrical components 14 can be completely disposed within the openings 19 in the spacer 18, as illustrated in FIG. 1, with the ends of the contact pin receptacles 24 being extended into the openings 19 to establish electrical contact with the electrical connector 16. Alternatively, as illustrated in FIG. 2, a reinforcement socket 27 can be secured to the electrical connector 16, and the contact pin receptacles 24 can be disposed within the openings 32 formed in a contact pin guide and strip holder 31 secured within the plug member 21. In extending the printed circuit board 11 with the spacer 18 affixed to it into the plug member 21, the reinforcement sockets 27 extend into the openings 32 in the contact pin guide and strip holder 31 to engage and establish electrical contact between the electrical connector 16 and the contact pin receptacles 24. A matrix assembly of this construction can be programed and/or encoded in the above-described fashion.

In FIG. 3 there is illustrated one manner in which interconnections can be established via the electrical components 14, between the printed conductor means 12 on the printed circuit board 11, and the printed conductor means 41 on a printed circuit board 40 disposed within the plug member 21. In this example, while not shown, the electrical components 14 are secured within the openings 19 of the spacer 18 and are affixed to the printed conductor means 12 on the printed circuit board 11 in the manner described above in connection with the embodiments of FIGS. 1 or 2. Preferably, a reinforcement socket 27 is affixed to the electrical conductors 16 of the electrical components 14, for reasons which will be more apparent from the following description.

The printed conductor means 41 on the printed circuit board 40 are plated through the holes 42 formed in the printed circuit board 40, as illustrated. The ends of the contact pin receptacles 24 extend into the holes 42 and are in electrical contact with the printed conductor means 41 on the side walls of the holes 42. Accordingly, it will be apparent that the electrical conductors 16, or the reinforcement sockets 27 affixed thereto, when plugged into the contact pin receptacles 24, will establish an electrical interconnection between the corresponding ones of the printed conductor means 12 on the printed circuit board 11 and the printed conductor means 41 on the printed circuit board 40.

Alternatively, while not shown, the contact pin receptacles 24 can be extended into the holes 42 in the printed circuit board 40 in a fashion such that normally no electrical contact is established between the contact pin receptacles 24 and the printed conductor means 41 on the printed circuit board 40. When the electrical connectors 16, or reinforcement sockets 27 affixed thereto, are plugged into the contact pin receptacles 24, the upper ends of the latter are forced outwardly to engage and to establish electrical contact with the printed conductor means 41. A matrix assembly 10 including a printed circuit board such as the printed circuit board 40 likewise can be programed and/or encoded, in the manner described above. Furthermore, as in the case of the embodiments disclosed in FIGS. 1 and 2, the programing or encoding of the matrix assembly can be changed easily, quickly and efficiently, simply by removing and replacing the appropriate ones of the contact pin receptacles 24.

It will thus be seen that the objects set forth above, among those made apparent from the preceding description, are efficiently attained and certain changes may be made in the above construction. Accordingly, it is intended that all matter contained in the above description or shown in the accompanying drawings shall be interpreted as illustrative and not in a limiting sense.

Now that the invention has been described, what is claimed as new and desired to be secured by Letters Patent is:

1. An assembly comprising a first printed circuit board having printed conductor means thereon, a spacer of electrical insulating material affixed to said first printed circuit board and having at least one opening extending therethrough, an electrical component having a pair of electrical connectors extending from the respective ends thereof positioned within said opening in said spacer with one of said pair of electrical connectors engaging a contact pin receptacle, to establish electrical contact therewith, the other one of said pair of electrical connectors being in electrical contact with said printed conductor means on said first printed circuit board, whereby an interconnection is established through said electrical component, between said printed conductor means on said first printed circuit board and said contact pin receptacle.

2. The assembly of claim 1, wherein said electrical component is completely disposed within said opening through said spacer, said contact pin receptacle being proportioned to extend into said opening engaging said one electrical connector, the side walls of said opening functioning to support said electrical component and to guide said contact pin receptacle into engagement with said one electrical connector.

3. The assembly of claim 1, wherein said electrical component is completely disposed within said opening through said spacer, a reinforcement socket affixed to said one electrical connector thereof and extending from said opening engaging with a contact pin receptacle to establish electrical contact therewith.

4. The assembly of claim 1, including a plurality of said electrical components, said spacer having at least a corresponding number of said openings extending through it receiving therein respective ones of said electrical connectors, one of said pair of electrical connectors of each of said plurality of electrical components being connected to and establishing electrical contact with said printed conductor means on said first printed circuit board, the other one of said pair of electrical connectors of each of said electrical components engaging one of a plurality of contact pin receptacles to establish electrical contact therewith.

5. The assembly of claim 4, further including means supporting at least one contact strip, said contact strip supporting a plurality of said contact pin receptacles in electrical contact therewith, whereby interconnections can be established between said printed conductor means on said first printed circuit board and said contact strip by plugging said one electrical connector of said electrical components into said contact pin receptacles supported by said contact strip.

6. The assembly of claim 5, wherein said electrical components are completely disposed within said openings through said spacer, said contact pin receptacles extending from said means supporting said contact strip and being proportioned to extend into said openings to engage said one electrical connector of said electrical components, the side walls of said openings functioning to support said electrical components and to guide said contact pin receptacle into engagement with said one electrical connector of said electrical components, thereby permitting said first printed circuit board to be plugged into said means supporting said contact strip.

7. The assembly of claim 5, wherein said means supporting said contact strip has a plurality of contact pin receptacle cavities formed therein, said contact strip removably supporting ones of said contact pin receptacles within said cavities, said electrical components being completely disposed within said openings through said spacer, a reinforcement socket affixed to said one electrical connector thereof and extending from said openings into said cavities and engaged with said contact pin receptacles to establish electrical contact therewith.

8. The assembly of claim 5, wherein said contact pin receptacles are removably supported by said contact strip, said contact pin receptacles being removed and replaced in supporting engagement by said contact strip to establish interconnections between predetermined printed conductor means on said first printed circuit board and said contact strip.

9. The assembly of claim 5, further including a second printed circuit board having at least one hole extending through it and printed conductor means thereon, said printed conductor means extending into and about the side wall of said hole, a contact pin receptacle disposed within said hole to be engageable by said one electrical connector on said electrical component, said one electrical connector when plugged into said contact pin receptacle frictionally forcing the latter into electrical contact with said printed conductor means about the side wall of said hole.

10. The assembly of claim 9, wherein said contact pin receptacle is positioned in a recessed position within said hole, said one electrical connector having a reinforcement socket affixed to it to extend into said hole to engage said contact pin receptacle.

* * * * *